United States Patent
Midha et al.

(10) Patent No.: US 9,331,681 B2
(45) Date of Patent: May 3, 2016

(54) SYSTEM AND METHOD FOR GAUSSIAN RANDOM NOISE GENERATION

(71) Applicant: STMicroelectronics International N.V., Amsterdam (NL)

(72) Inventors: Gagan Midha, Noida (IN); Archit Joshi, Bhopal (IN)

(73) Assignee: STMICROELECTRONICS INTERNATIONAL N.V, Amsterdam (NL)

( * ) Notice: Subject to any disclaimer, the term of this patent is extended or adjusted under 35 U.S.C. 154(b) by 212 days.

(21) Appl. No.: 14/072,373

(22) Filed: Nov. 5, 2013

(65) Prior Publication Data

US 2015/0123721 A1    May 7, 2015

(51) Int. Cl.
*H03K 3/84* (2006.01)

(52) U.S. Cl.
CPC ........................................ *H03K 3/84* (2013.01)

(58) Field of Classification Search
None
See application file for complete search history.

(56) References Cited

U.S. PATENT DOCUMENTS

| | | | | |
|---|---|---|---|---|
| 5,121,349 A * | 6/1992 | Naito | ............................. | 708/252 |
| 5,359,662 A * | 10/1994 | Yuan et al. | ................. | 381/71.14 |
| 6,072,823 A * | 6/2000 | Takakusaki | .................... | 375/130 |
| 6,263,082 B1 * | 7/2001 | Ishimoto et al. | ................ | 380/46 |
| 6,559,712 B2 * | 5/2003 | Gabet et al. | .................... | 327/551 |
| 2003/0122967 A1 * | 7/2003 | Kondo et al. | ................. | 348/607 |
| 2004/0017880 A1 * | 1/2004 | Toth et al. | ......................... | 378/4 |
| 2005/0036636 A1 * | 2/2005 | Noro et al. | ..................... | 381/124 |
| 2014/0276115 A1 * | 9/2014 | Dalvi et al. | .................... | 600/479 |

\* cited by examiner

*Primary Examiner* — Cassandra Cox
(74) *Attorney, Agent, or Firm* — Slater Matsil, LLP

(57) ABSTRACT

In accordance with an embodiment, a method of generating noise includes generating, using a hardware-based noise generator, a plurality of periodic waveforms having different frequencies, weighting, using the hardware-based noise generator, amplitudes of the plurality of periodic waveforms based on a predetermined spectral shape to form a plurality of weighted waveforms, and summing the plurality of plurality of weighted waveforms to form an output random noise signal.

18 Claims, 8 Drawing Sheets

SYSTEM AND METHOD FOR GAUSSIAN RANDOM NOISE GENERATION

TECHNICAL FIELD

The present invention relates generally to signal processing, and, in particular, to a system and method for noise generation.

BACKGROUND

In communication system channels, noise generated by devices such as metal oxide semiconductor (MOS) devices, resistors, and bipolar junction transistors (BJTs) are generally modeled as Gaussian random noise, which has a probability density function (PDF) of a normal or Gaussian distribution and a colored or frequency dependent power spectral density (PSD). A communications channel may be modeled along with receiver circuitry in a simulation environment or using a hardware implementation.

While the design of many systems, such as communications systems, is designed to minimize the effects of noise, there are some applications in which Gaussian random noise is purposefully generated. For example, in the fields of data encryption, speech coding, Gaussian random noise may be generated to produce secure encryption keys and/or provide audio stimulus to digital filters to produce vocal sounds.

Noise generators may also be used to simulate the effects of additive noise generated in a communications channel and/or noise generated by the circuit devices present in a receiver and/or transmitter. Such simulated noise may be used to simulate the effect of noise in analog components of mixed signal systems such as phase locked loops (PLLs) and clock and data recovery (CDR) circuits. Modeling of the noise of a voltage controlled oscillator (VCO) may be performed to evaluate performance parameters such as period jitter and phase error. This modeling may be performed in a high level simulation environment such as MATLAB or System C.

SUMMARY OF THE INVENTION

In accordance with an embodiment, a method of generating noise includes generating, using a hardware-based noise generator, a plurality of periodic waveforms having different frequencies, weighting, using the hardware-based noise generator, amplitudes of the plurality of periodic waveforms based on a predetermined spectral shape to form a plurality of weighted waveforms, and summing the plurality of plurality of weighted waveforms to form an output random noise signal.

BRIEF DESCRIPTION OF THE DRAWINGS

For a more complete understanding of the present invention, and the advantages thereof, reference is now made to the following descriptions taken in conjunction with the accompanying drawing, in which.

Corresponding numerals and symbols in different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a system and method for modeling a system with Gaussian random noise. The invention may also be applied, however, to other types of circuits, systems, and methods, such as other modeling circuits, systems, and methods.

Simulators are often used to model systems and may be used to model a communications channel. Gaussian random noise may be used in performing simulations. For example, the Gaussian noise may be used to introduce non-idealities of a real system into a simulation environment, such that Gaussian noise is generated according to a specified power spectral density (PSD) of a noise source to be modeled.

Figure 1:
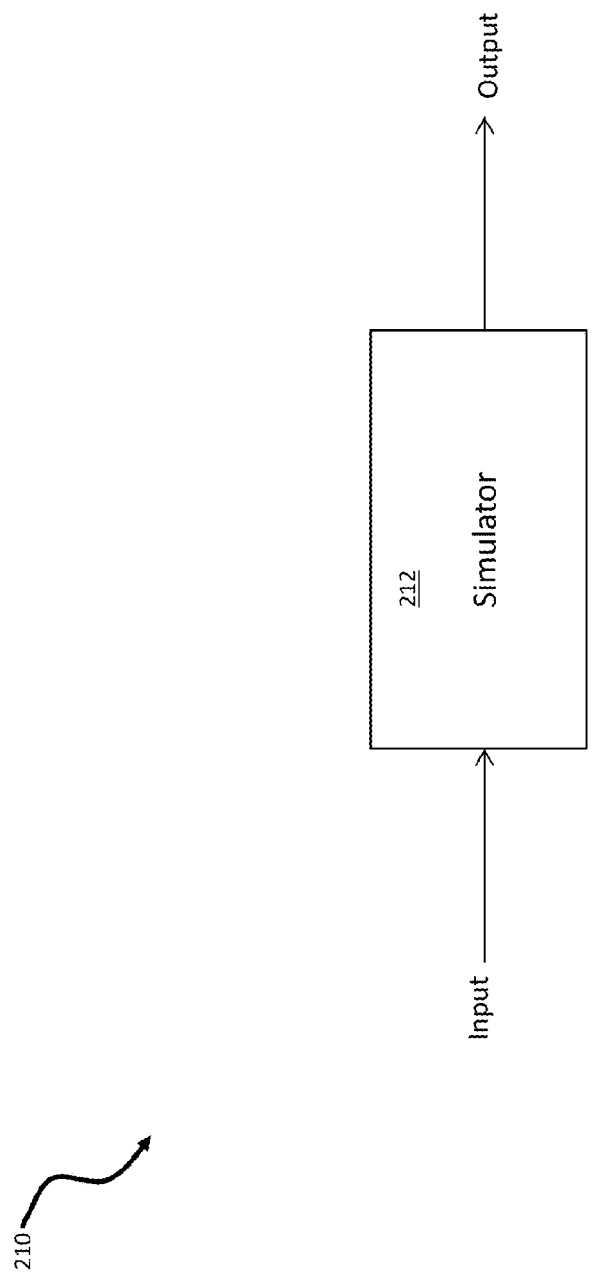
FIG. 1 illustrates an embodiment simulator used to model a system.
Figure 2:
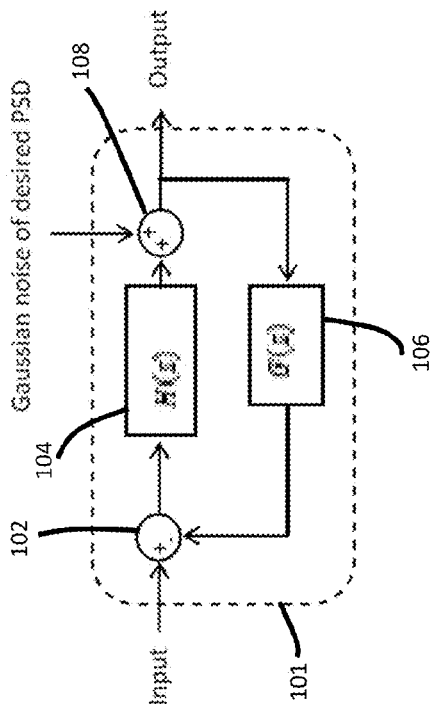
FIG. 2 illustrates a block diagram of an embodiment simulation scenario.

FIG. 1 illustrates system 210 for modeling a system. An input is received by simulator 212, and an output is produced by simulator 212 based on the input. Simulator 212 may generate Gaussian random noise in performing the simulation. In one example, simulator 212 is a computer, which performs simulations, for example, using MATLAB, C, or Simulink. The simulator may be used to model a circuit such as, but not limited to a phase-locked loop (PLL), a frequency-locked loop (FLL), a clock and data recovery unit (CDR), or another type of integrated circuit. FIG. 2 illustrates block diagram 100 of an embodiment simulation scenario that shows how noise may be modeled in feedback system 101, such as a PLL, an FLL, or a CDR. Feedback system 101 may be represented having a forward transfer function 104 of H(s), feedback transfer function 106 of G(s), and error summing junction 102 that subtracts the output of feedback transfer function 106 from the input. Modeled Gaussian noise is summed at the output of forward transfer function 104. This modeled Gaussian noise may have a flat spectrum or a particular PSD. The elements of block diagram 100 are simulated using software such as, but not limited to, MATLAB or System C running on a computer. It should be understood that feedback system 101 is just one example of a system that may be modeled and simulated using embodiment techniques. In alternative embodiments of the present invention, other systems may be simulated. For example, systems of a generic nature, such as feedback systems, non-feedback systems, systems representable using a block diagram, and systems having no transfer functions, may be simulated.

Figure 3:
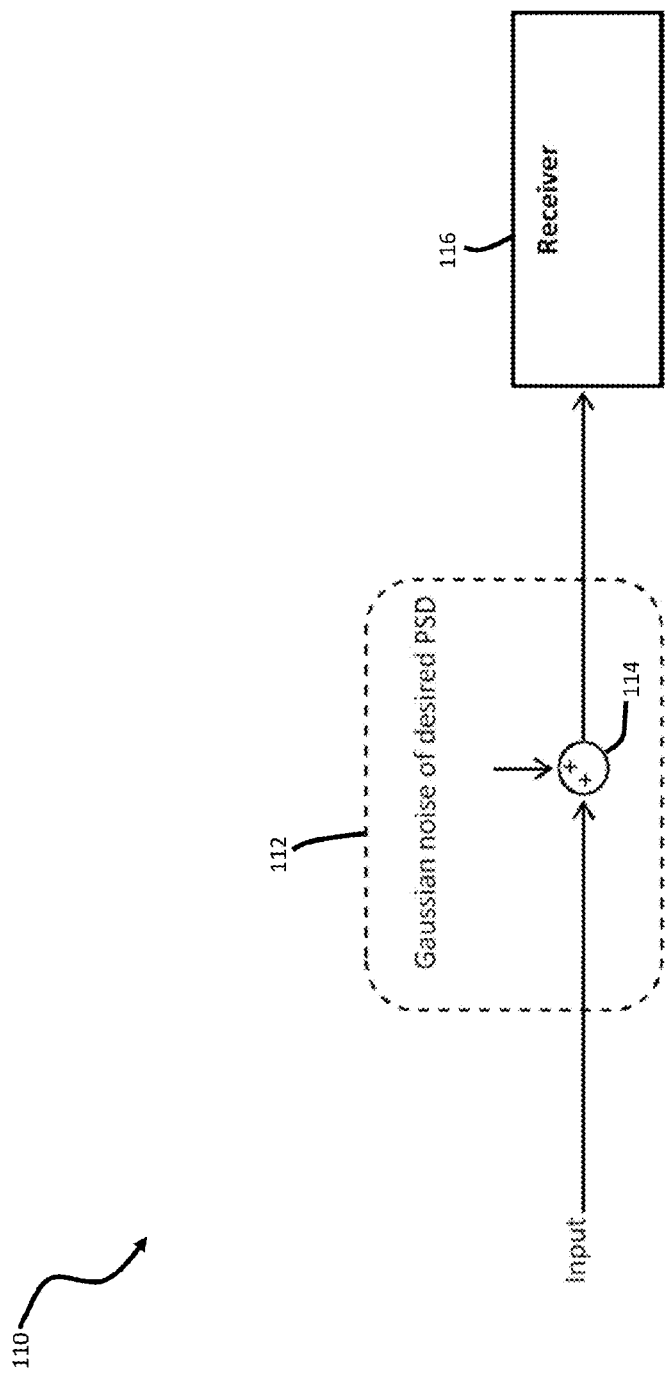
FIG. 3 illustrates an additional embodiment system for modeling a system.

FIG. 3 illustrates block diagram 110 that shows how noise may be modeled in a communication system. Block 112 represents a communication channel that sums generated Gaussian random noise to a signal input via summing junction 114. The output of communication channel is coupled to receiver 116. Again, this modeled Gaussian noise may have a flat spectrum, or may have a particular PSD. The elements of block diagram 110 may be simulated by software running on a computer or dedicated hardware. Dedicated hardware may include, for example, an emulation environment implemented using hardware such as field programmable gate arrays (FPGAs) or other hardware. In some embodiments, such emulation hardware may generate simulated noise in real time. One conventional way to generate noise is to generate Gaussian noise using an inverse fast Fourier transform (IFFT) or pass the generated noise though a series of filters to obtain a specified PSD.

Figure 4:
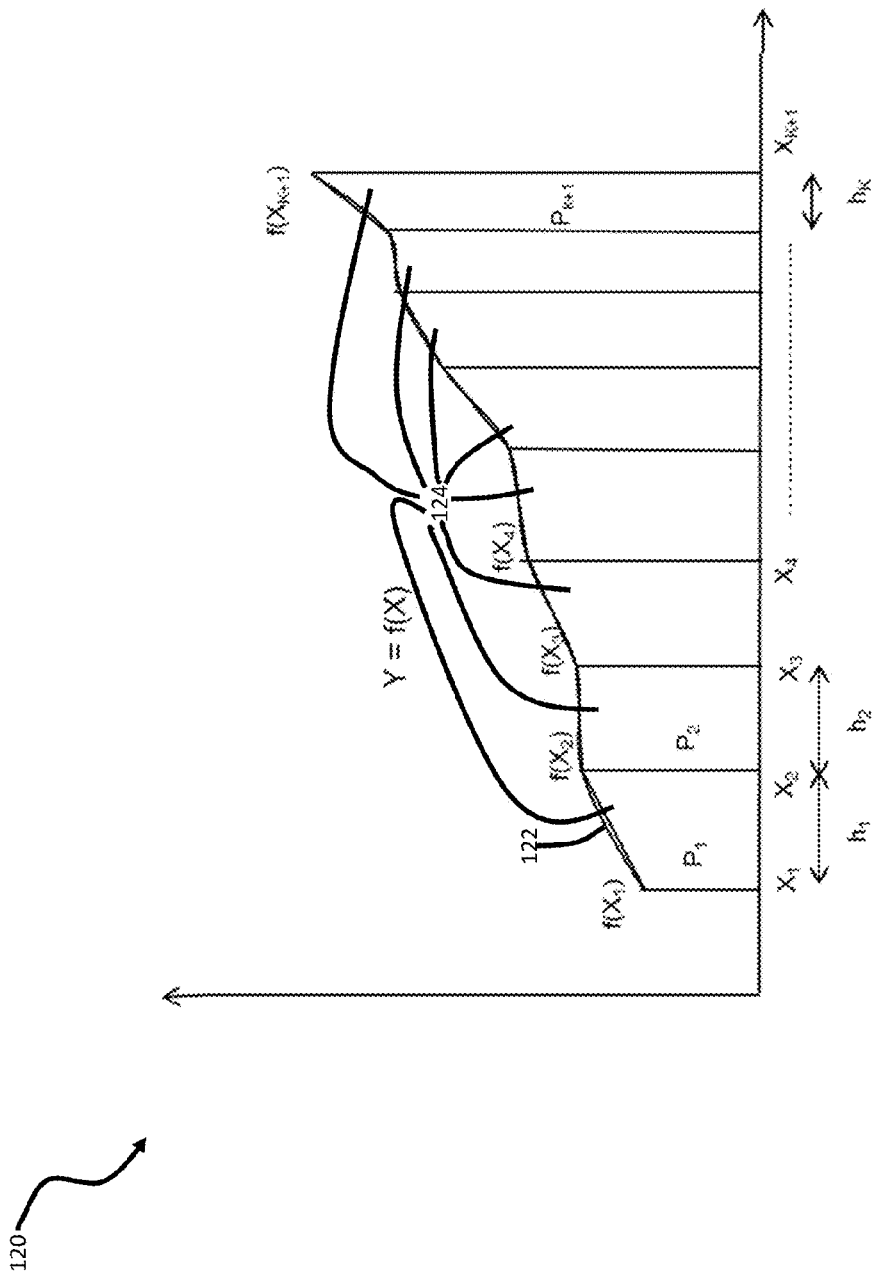
FIG. 4 illustrates a graph of power spectral density (PSD) versus frequency for determining root mean square (RMS) power with trapezoidal segments.

In an embodiment, a direct digital frequency method is used to generate Gaussian random noise by generating a series of sinusoids of random phases and scaled amplitudes. This relationship can be derived by considering the PSD graph 120 shown in FIG. 4. Curve 122 represents a noise PSD, f(x), the integral of which provides the root-mean-squared (RMS) power of the signal. As illustrated, the PSD plot is broken into K trapezoidal area segments 124, and the frequency boundaries for the trapezoidal segments may be selected either uniformly or non-uniformly. Non-uniform frequency points are illustrated in graph 120. The area of a trapezoidal segment $P_i$ is given by:

$$P_i = \frac{1}{2}(f(X_{i+1}) + f(X_i)) \times h_i,$$

where $h_i$ is the width of the trapezoid. A sinusoid at each particular frequency $X_i$ may be used to represent the RMS power of the trapezoidal segments in the time domain. The amplitude of the sinusoid $A_i$ with an RMS power $P_i$ is given by:

$$\sqrt{2P_i}.$$

The sinusoids of the RMS power obtained from the PSD plots are added in time, with a random phase, applied to obtain the PSD in the frequency domain. The noise in the time domain is given by:

$$N(m) = \sum_{i=1}^{K} A_i \sin\left(\frac{2\pi X_i m}{fs} + ph_i\right),$$

where $ph_i$ is the random phase offset, which varies from 0 to $2\pi$, and fs is the sampling frequency. This random phase offset may be determined, for example, using a pseudo-random algorithm or a pseudo-random number generator known in the art or by using a predetermined table of randomized values. It should be understood that embodiment noise generation systems and method may be used to generate noise having both Gaussian and non-Gaussian probability density functions (PDFs). Examples of non-Gaussian PDFs include, for example, uniform and Rayleigh PDFs.

The number of sinusoids that are parameterized and the segmentation of the PSD may be uniform or non-uniform. Non-uniform segmentation may decrease the density of sinusoids when the power weightage of the PSD plot is low and increase the density of sinusoids when the power weightage of the PSD plot is high. In one example, K sinusoids may be calculated using, for example, a Taylor series or other methods. The number of sinusoids K determines how closely the generated noise resembles Gaussian PDF. For example, increasing the number of sinusoids used may make the noise more Gaussian.

Figure 5:
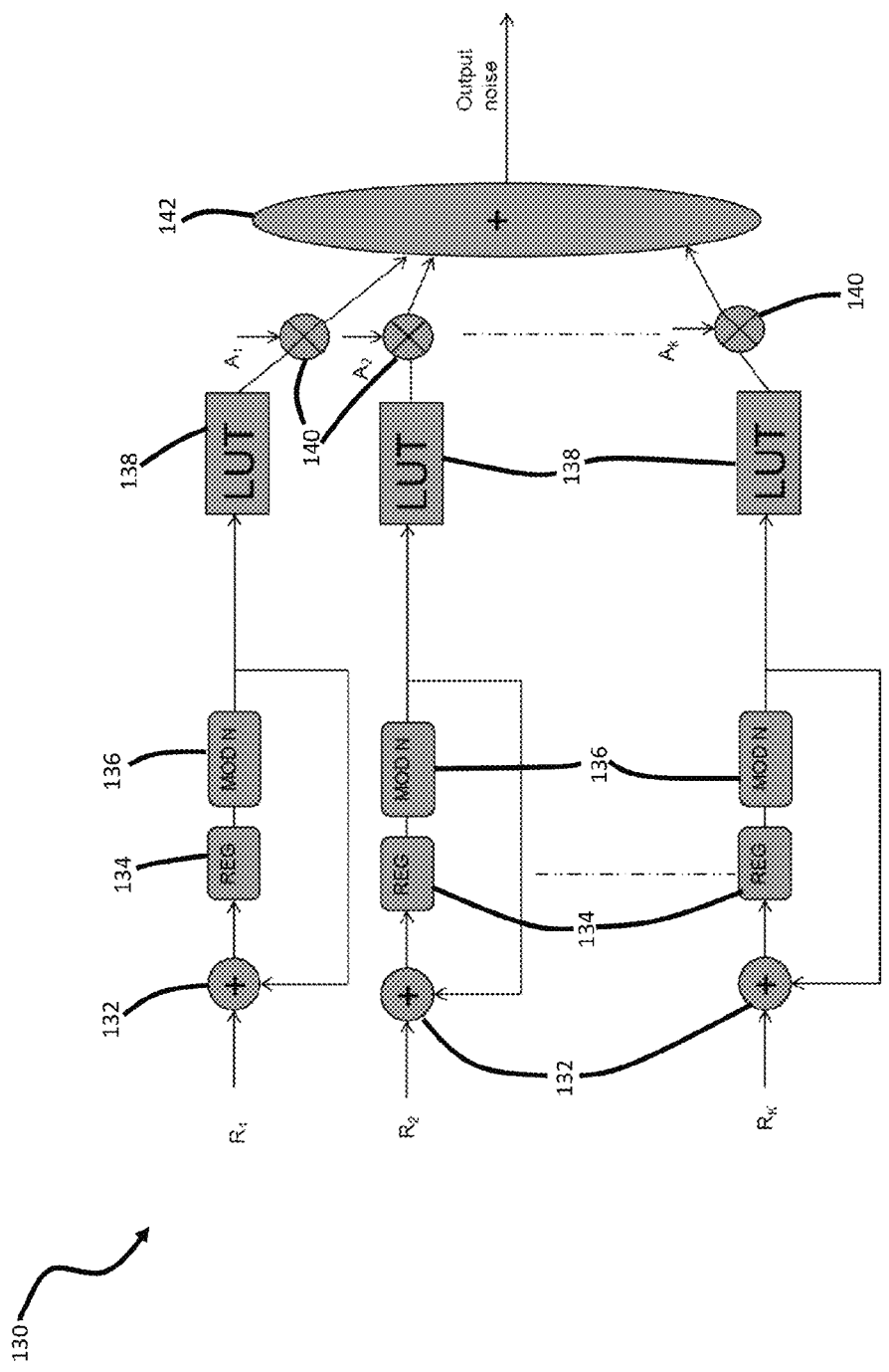
FIG. 5 illustrates an embodiment structure for generating random noise.

In an embodiment, direct digital frequency synthesis is used to calculate the K sinusoids for Gaussian random noise generation. The samples of the lowest frequency signal may be saved in a lookup table (LUT). If the frequency points are an integer multiple of the lowest frequency, the time samples may be obtained from the time samples of the lowest frequency samples. FIG. 5 illustrates diagram 130 for implementing direct digital frequency synthesis. The input $R_i$, which is equal to $X_i/X_b$, is an integer. $X_b$ is the lowest frequency, and $X_i$ is an integer multiple of $X_b$. Feedback, when available, is added to $R_i$ by adders 132. In an embodiment, the initial value of register (REG) 134 is a random number that may be generated using, for example, a pseudo random binary sequence generator. This initial (REG) value provides the phase offset. The values stored in registers 134 are passed through modulo (MOD) N blocks 136, where N is the number of points in a single period of $X_b$. The output of modulo N blocks 136 is fed to adders 132 to provide feedback. In addition, the output of modulo N blocks 136 is used to consult lookup tables 138. Lookup tables 138 contain N samples of the lowest frequency sinusoids, including samples of the base frequency sinusoid. The sample precision may be based on signal-to-noise ratio (SNR) targets for the representation of the PSD. For example, eight bits may be used. The outputs of lookup tables 138 are multiplied by amplitudes of the sinusoids $A_i$ by multipliers 140. The sinusoid amplitudes are determined based on the RMS power. This may be calculated using a series of trapezoids on a PSD plot. The sinusoids are added together by adder 142 to produce the output noise.

In embodiments, adders 132, registers 134 modulo N blocks 136, lookup tables 138, multipliers 140, and adder 142 may be implemented using hardware blocks or by software routines running on a processor. For example, in one embodiment, each of the adders 132, registers 134, modulo N blocks 136, lookup tables 138, multipliers 140, and adder 142 are implemented using separate parallel digital circuits. In some embodiments, lookup table 138 and multipliers 140 may be implemented using one or more time-shared combination of lookup tables and digital multipliers, the output of which is accumulated. It should be further understood the embodiment of FIG. 5 is just one of many examples of embodiment noise generators.

Figure 6:
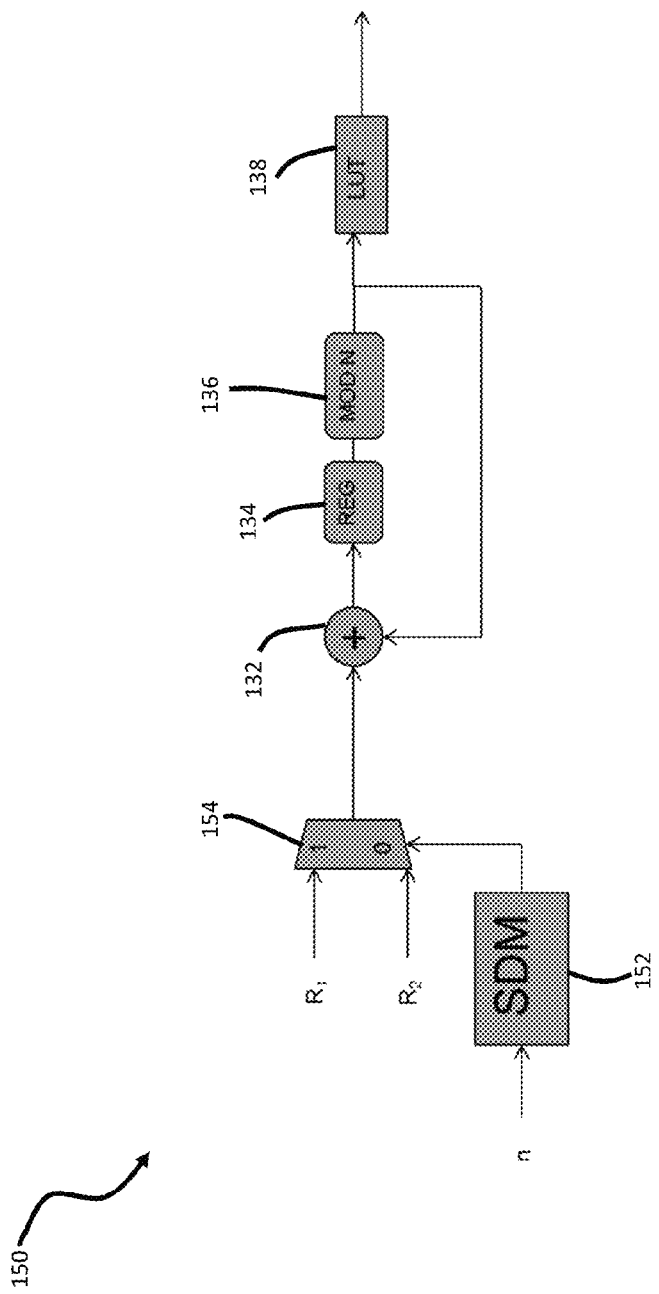
FIG. 6 illustrates an embodiment structure for fractional frequency generation.

For frequencies that are not integer multiples of the lowest frequency, Sigma delta modulation (SDM) may be used for direct digital frequency synthesis. FIG. 6 illustrates diagram 150 for performing direct digital frequency synthesis on frequencies which are not integer multiples of the lowest frequency. The input n is given by $$n = \frac{X_2 - X_f}{X_2 - X_1},$$

where $X_f$ is the fractional frequency, which ranges between $X_1$ and $X_2$. This value is fed into SDM block 152. SDM is a process in which the frequency distribution of the quantization noise is altered such that the quantization noise density is reduced in the signal band. Some SDM blocks may be configured to push low frequency quantization noise to higher frequencies. This high frequency noise may be filtered by passing the output of the SDM though a low pass filter. Such low pass filtering may also be applied in cases where the PSD is negligible for high frequency components. SDM block 152 has two output levels, for 0 and 1. The output of SDM block 152 toggles between ratio R1 and ratio R2 using multiplexer 154. The output of multiplexer 154 is then fed to adder 132 in place of $R_i$ in FIG. 5.

In an embodiment, to prevent overload of the SDM block 152, input n to SDM block 152 may be limited. Alternatively, the output levels may be increased by toggling between more than two sinusoids.

Figure 7:
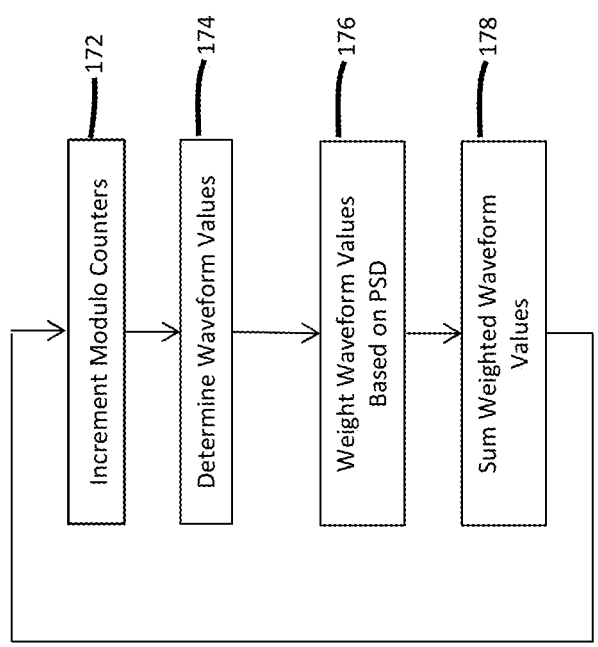
FIG. 7 illustrates a block diagram of an embodiment method.

FIG. 7 illustrates flowchart 170 of an embodiment method for generating random noise. In steps 172 and 174, a plurality of waveforms is generated at various frequencies by incrementing a plurality of modulo counters (step 172) and determining waveform values based on the output of the modulo counters (step 174). In some embodiments, the waveform values are determined, for example, by using a lookup table that may be implemented in software or hardware. Moreover, the modulo counters may be implemented using counters implemented in hardware or in software. In an embodiment, the modulo counters are incremented at a sampling frequency rate of fs. In some embodiments, such as the embodiment in FIG. 6, the modulo counters are incremented by $R_i$ at each cycle of sampling frequency (fs).

Next, in step 176, the waveform values are weighted based on a predetermined PSD. In some embodiments, each of the determined waveforms may be multiplied by a weight using a software multiplication routine or by using a hardware multiplier. In step 178, weighted waveform values are summed together to form a sample of the generated noise. Steps 172, 174, 176, and 178 may then be repeated.

Figure 8:
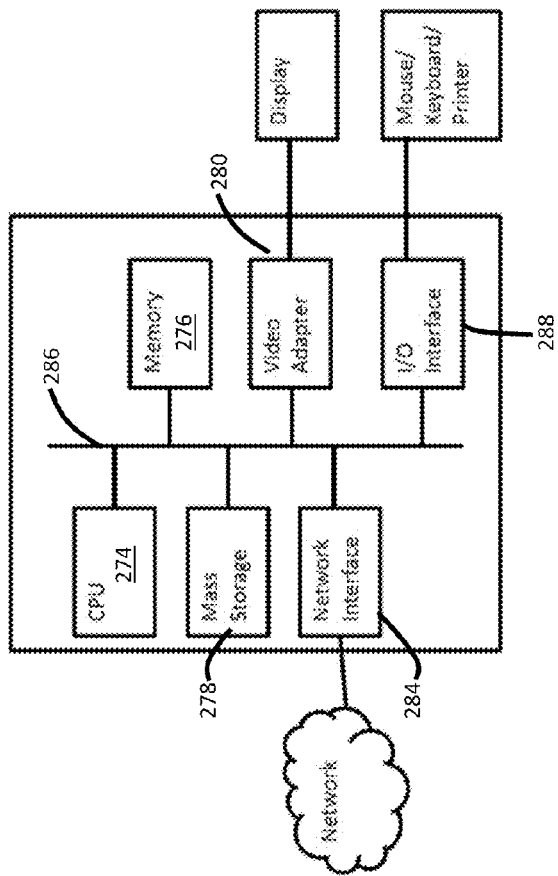
FIG. 8 illustrates a block diagram of an embodiment general-purpose computer system.

FIG. 8 illustrates a block diagram of processing system 270 that may be used for implementing the devices and methods disclosed herein. Specific devices may utilize all of the components shown, or only a subset of the components, and levels of integration may vary from device to device. Furthermore, a device may contain multiple instances of a component, such as multiple processing units, processors, memories, transmitters, receivers, etc. The processing system may comprise a processing unit equipped with one or more input devices, such as a microphone, mouse, touchscreen, keypad, keyboard, and the like. Also, processing system 270 may be equipped with one or more output devices, such as a speaker, a printer, a display, and the like. The processing unit may include central processing unit (CPU) 274, memory 276, mass storage device 278, video adapter 280, and I/O interface 288 connected to a bus 286.

The bus may be one or more of any type of several bus architectures including a memory bus or memory controller, a peripheral bus, video bus, or the like. CPU 274 may comprise any type of electronic data processor. Memory 276 may comprise any type of system memory such as static random access memory (SRAM), dynamic random access memory (DRAM), synchronous DRAM (SDRAM), read-only memory (ROM), a combination thereof, or the like. In an embodiment, the memory may include ROM for use at boot-up, and DRAM for program and data storage for use while executing programs.

Mass storage device 278 may comprise any type of storage device configured to store data, programs, and other information and to make the data, programs, and other information accessible via the bus. Mass storage device 278 may comprise, for example, one or more of a solid state drive, hard disk drive, a magnetic disk drive, an optical disk drive, or the like.

Video adaptor 280 and I/O interface 288 provide interfaces to couple external input and output devices to the processing unit. As illustrated, examples of input and output devices include the display coupled to the video adapter and the mouse/keyboard/printer coupled to the I/O interface. Other devices may be coupled to the processing unit, and additional or fewer interface cards may be utilized. For example, a serial interface card (not pictured) may be used to provide a serial interface for a printer.

The processing unit also includes one or more network interface 284, which may comprise wired links, such as an Ethernet cable or the like, and/or wireless links to access nodes or different networks. Network interface 284 allows the processing unit to communicate with remote units via the networks. For example, the network interface may provide wireless communication via one or more transmitters/transmit antennas and one or more receivers/receive antennas. In an embodiment, the processing unit is coupled to a local-area network or a wide-area network for data processing and communications with remote devices, such as other processing units, the Internet, remote storage facilities, or the like.

Advantages of embodiments include the ability to accurately generate Gaussian noise of any PSD. Embodiment noise generation systems and methods may be implemented in a highly parameterized and flexible fashion having a low complexity, thereby making embodiment noise generation systems and methods good candidates for digital implementation or noise modeling in design simulators where simulation time is a constraint.

An example method of generating noise includes generating, using a hardware-based noise generator, a plurality of periodic waveforms having different frequencies and weighting, using the hardware-based noise generator, amplitudes of the plurality of periodic waveforms based on a predetermined spectral shape to form a plurality of weighted waveforms. The method may also include summing the plurality of plurality of weighted waveforms to form an output random noise signal.

In an embodiment, the output random noise signal has a Gaussian distribution and a spectral shape according to the predetermined spectral shape. In an additional example, generating further includes randomizing an initial phases of the plurality of periodic waveforms. In a further example method, determining the initial phases includes using a pseudo random number generator. The hardware-based noise generator may include a computing device having a processor and a memory. Alternatively, the hardware-based noise generator includes dedicated hardware.

The plurality of periodic waveforms may be sinusoidal. In an embodiment, generating each of the plurality of periodic waveforms includes performing a direct digital synthesis. In another embodiment, generating each of the plurality of periodic waveforms includes incrementing a counter, determining a first waveform value based on an output of the counter, and weighting each of the plurality of periodic waveforms includes scaling the first waveform value. Also, the method may include incrementing the counter including incrementing a modulo counter. In an additional embodiment, incrementing the counter includes using a sigma-delta modulator to increment the counter at a fractional frequency. In another example, determining the first waveform value includes using a lookup table.

An example system for generating random noise includes a hardware-based noise generator configured to generate a plurality of sinusoidal waveforms having different frequencies, weight amplitudes of the plurality of sinusoidal waveforms to form weighted waveforms, and add the weighted waveforms together to form an output random noise signal.

In an example system, the hardware-based noise generator is further configured to randomize phases of the plurality of sinusoidal waveforms. The hardware-based noise generator may include a pseudo-random noise generator. Alternatively, the hardware-based noise generator includes a plurality of direct digital synthesizers, a plurality of multipliers coupled to corresponding outputs of the plurality of direct digital synthesizers, and a summing circuit coupled to outputs of the plurality of direct digital synthesizers. In an embodiment, at least one of the plurality of direct digital synthesizers includes a modulo counter and a lookup table coupled to the output of the modulo counter. An example system further includes a sigma-delta modulator coupled to an input of the modulo counter, where the sigma-delta modulator is configured to select between at least two counting ratios to generate a fractional frequency.

An embodiment method of simulating a circuit includes providing a model of a target circuit having at least one input, generating, using a hardware-based noise generator, a plurality of periodic waveforms using direct digital synthesis, where the plurality of periodic waveforms have different frequencies and randomized phases, weighting, using the hardware-based noise generator, amplitudes of the plurality of periodic waveforms based on a predetermined spectral shape to form a plurality of weighted waveforms, summing the plurality of plurality of weighted waveforms to form an output random noise signal, and simulating the model of the target circuit using a computer, where simulating includes introducing the random noise signal to the at least one input and providing simulation output data. In one example, the hardware-based noise generator includes the computer. In another example, generating each of the plurality of periodic waveforms includes incrementing a counter, determining a first waveform value based on an output of the counter, and weighting each of the plurality of periodic waveforms including scaling the first waveform value.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of generating noise comprising:
generating, using a hardware-based noise generator, a plurality of periodic waveforms having different frequencies;
weighting, using the hardware-based noise generator, amplitudes of the plurality of periodic waveforms based on a predetermined spectral shape to form a plurality of weighted waveforms; and
summing the plurality of weighted waveforms to form an output random noise signal, wherein the output random noise signal has a Gaussian distribution and a spectral shape according to the predetermined spectral shape.

2. The method of claim 1, wherein generating further comprises randomizing an initial phases of the plurality of periodic waveforms.

3. The method of claim 1, wherein the hardware-based noise generator comprises dedicated hardware.

4. The method of claim 1, wherein the plurality of periodic waveforms is sinusoidal.

5. A method of generating noise comprising:
generating, using a hardware-based noise generator, a plurality of periodic waveforms having different frequencies;
weighting, using the hardware-based noise generator, amplitudes of the plurality of periodic waveforms based on a predetermined spectral shape to form a plurality of weighted waveforms; and
summing the plurality of weighted waveforms to form an output random noise signal, wherein
generating further comprises randomizing an initial phases of the plurality of periodic waveforms, and
determining the initial phases comprises using a pseudo random number generator.

6. A method of generating noise comprising:
generating, using a hardware-based noise generator, a plurality of periodic waveforms having different frequencies;
weighting, using the hardware-based noise generator, amplitudes of the plurality of periodic waveforms based on a predetermined spectral shape to form a plurality of weighted waveforms; and
summing the plurality of weighted waveforms to form an output random noise signal, wherein the hardware-based noise generator comprises a computing device having a processor and a memory.

7. A method of generating noise comprising:
generating, using a hardware-based noise generator, a plurality of periodic waveforms having different frequencies;
weighting, using the hardware-based noise generator, amplitudes of the plurality of periodic waveforms based on a predetermined spectral shape to form a plurality of weighted waveforms; and
summing plurality of weighted waveforms to form an output random noise signal, wherein generating each of the plurality of periodic waveforms comprises performing a direct digital synthesis.

8. A method of generating noise comprising:
generating, using a hardware-based noise generator, a plurality of periodic waveforms having different frequencies;
weighting, using the hardware-based noise generator, amplitudes of the plurality of periodic waveforms based on a predetermined spectral shape to form a plurality of weighted waveforms; and
summing the plurality of weighted waveforms to form an output random noise signal, wherein generating each of the plurality of periodic waveforms comprises
incrementing a counter,
determining a first waveform value based on an output of the counter, and
weighting each of the plurality of periodic waveforms comprises scaling the first waveform value.

9. The method of claim 8, wherein incrementing the counter comprises incrementing a modulo counter.

10. The method of claim 8, wherein incrementing the counter comprises using a sigma-delta modulator to increment the counter at a fractional frequency.

11. The method of claim 8, wherein determining the first waveform value comprises using a lookup table.

12. A system for generating random noise comprising:
a hardware-based noise generator configured to
generate a plurality of sinusoidal waveforms having different frequencies,
weight amplitudes of the plurality of sinusoidal waveforms to form weighted waveforms, and
add the weighted waveforms together to form an output random noise signal, wherein the hardware-based noise generator comprises
a plurality of direct digital synthesizers, a plurality of multipliers coupled to corresponding outputs of the plurality of direct digital synthesizers, and a summing circuit coupled to outputs of the plurality of direct digital synthesizers.

13. The system of claim 12, wherein the hardware-based noise generator is further configured to randomize phases of the plurality of sinusoidal waveforms.

14. The system of claim 13, wherein the hardware-based noise generator comprises a pseudo-random noise generator.

15. The system of claim 13, wherein at least one of the plurality of direct digital synthesizers comprises:

a modulo counter; and a lookup table coupled to an output of the modulo counter.

16. The system of claim 15, further comprising a sigma-delta modulator coupled to an input of the modulo counter, wherein the sigma-delta modulator is configured to select between at least two counting ratios to generate a fractional frequency.

17. A method of simulating a circuit comprising:

providing a model of a target circuit having at least one input;

generating, using a hardware-based noise generator, a plurality of periodic waveforms using direct digital synthesis, wherein the plurality of periodic waveforms have different frequencies and randomized phases;

weighting, using the hardware-based noise generator, amplitudes of the plurality of periodic waveforms based on a predetermined spectral shape to form a plurality of weighted waveforms;

summing the plurality of weighted waveforms to form an output random noise signal; and simulating the model of the target circuit using a computer, wherein simulating comprises introducing the output random noise signal to the at least one input and providing simulation output data, wherein the hardware-based noise generator comprises the computer.

18. A method of simulating a circuit comprising:

providing a model of a target circuit having at least one input;

generating, using a hardware-based noise generator, a plurality of periodic waveforms using direct digital synthesis, wherein the plurality of periodic waveforms have different frequencies and randomized phases;

weighting, using the hardware-based noise generator, amplitudes of the plurality of periodic waveforms based on a predetermined spectral shape to form a plurality of weighted waveforms;

summing the plurality of weighted waveforms to form an output random noise signal; and simulating the model of the target circuit using a computer, wherein simulating comprises introducing the output random noise signal to the at least one input and providing simulation output data, wherein generating each of the plurality of periodic waveforms comprises:

incrementing a counter;

determining a first waveform value based on an output of the counter; and weighting each of the plurality of periodic waveforms comprises scaling the first waveform value.

* * * * *